(12) United States Patent
Sciaini et al.

(10) Patent No.: US 11,075,054 B2
(45) Date of Patent: Jul. 27, 2021

(54) NANOFLUIDIC CELL SYSTEM

(71) Applicants: Germán Sciaini, Waterloo (CA); Ariel Petruk, Waterloo (CA)

(72) Inventors: Germán Sciaini, Waterloo (CA); Ariel Petruk, Waterloo (CA)

( * ) Notice: Subject to any disclaimer, the term of this patent is extended or adjusted under 35 U.S.C. 154(b) by 0 days.

(21) Appl. No.: 16/382,613

(22) Filed: Apr. 12, 2019

(65) Prior Publication Data
US 2020/0328059 A1  Oct. 15, 2020

Related U.S. Application Data

(60) Provisional application No. 62/656,418, filed on Apr. 12, 2018.

(51) Int. Cl.
*H01J 37/20* (2006.01)
*G02B 21/34* (2006.01)

(52) U.S. Cl.
CPC ............. *H01J 37/20* (2013.01); *G02B 21/34* (2013.01)

(58) Field of Classification Search
USPC .................................................. 250/442.11
See application file for complete search history.

(56) References Cited

U.S. PATENT DOCUMENTS

| | | | |
|---|---|---|---|
| 6,438,279 B1* | 8/2002 | Craighead | G02B 6/136 356/246 |
| 7,807,979 B2 | 10/2010 | Liu et al. | |
| 8,178,851 B2* | 5/2012 | Deshmukh | H01J 37/228 250/440.11 |
| 8,557,518 B2* | 10/2013 | Jovanovich | C12Q 1/686 435/6.1 |
| 9,196,457 B2* | 11/2015 | Grogan | H01J 37/20 |
| 9,207,196 B2* | 12/2015 | De Jonge | H01J 37/20 |
| 9,524,850 B2 | 12/2016 | Zandbergen et al. | |
| 9,548,184 B2 | 1/2017 | Creemer et al. | |
| 9,752,978 B2* | 9/2017 | Kraiczek | G01N 33/54373 |
| 9,812,285 B2 | 11/2017 | Dona et al. | |
| 10,128,079 B2 | 11/2018 | Walden, II et al. | |
| 10,504,688 B2* | 12/2019 | Maebashi | H01J 37/20 |

* cited by examiner

*Primary Examiner* — Phillip A Johnston

(57) ABSTRACT

A cell for use in a microscope has a pair of dies, the dies defining: a pair of slit-shaped windows disposed on opposite surfaces of the cell and arranged in perpendicular and spaced relation to one another to define a viewable volume interiorly of the cell at the region of overlap; a flow channel which includes the viewable volume and overlies and is substantially coterminous with one of the pair of slit-shaped windows; an elongate channel defined between the dies and leading towards the flow channel; and a conduit defined between the dies and coupling the elongate channel to the flow channel.

11 Claims, 24 Drawing Sheets

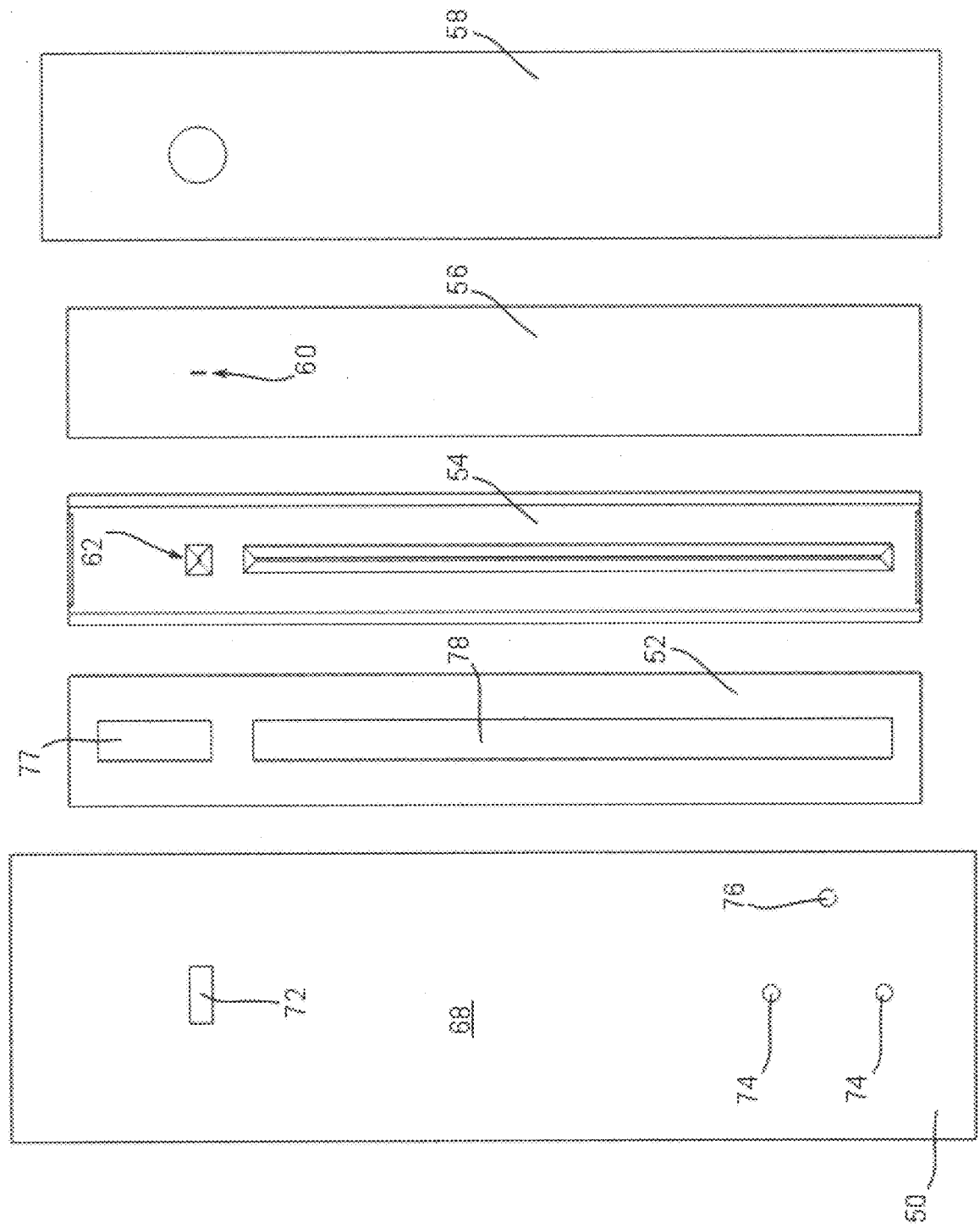

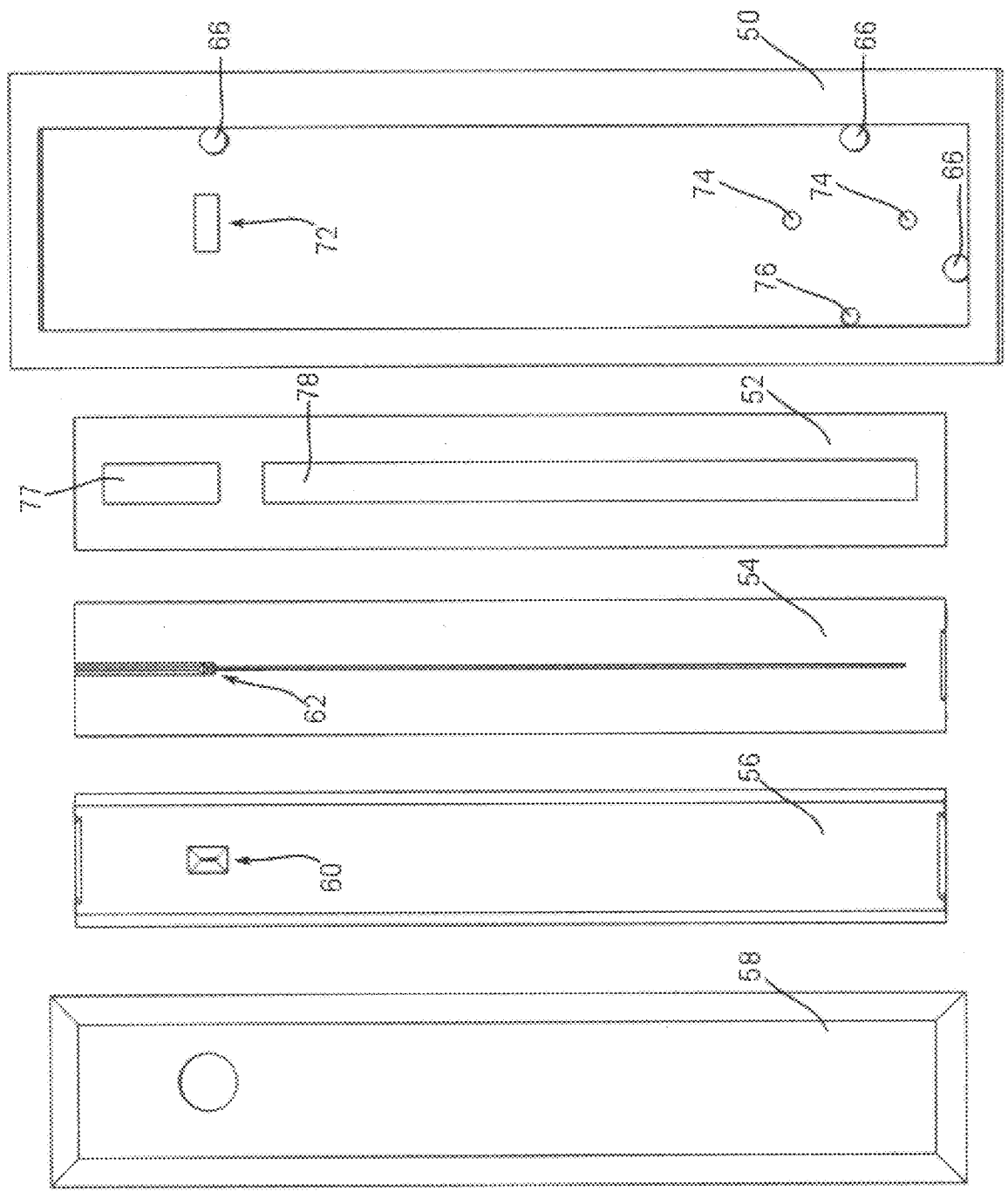

NOT TO SCALE

NOT TO SCALE

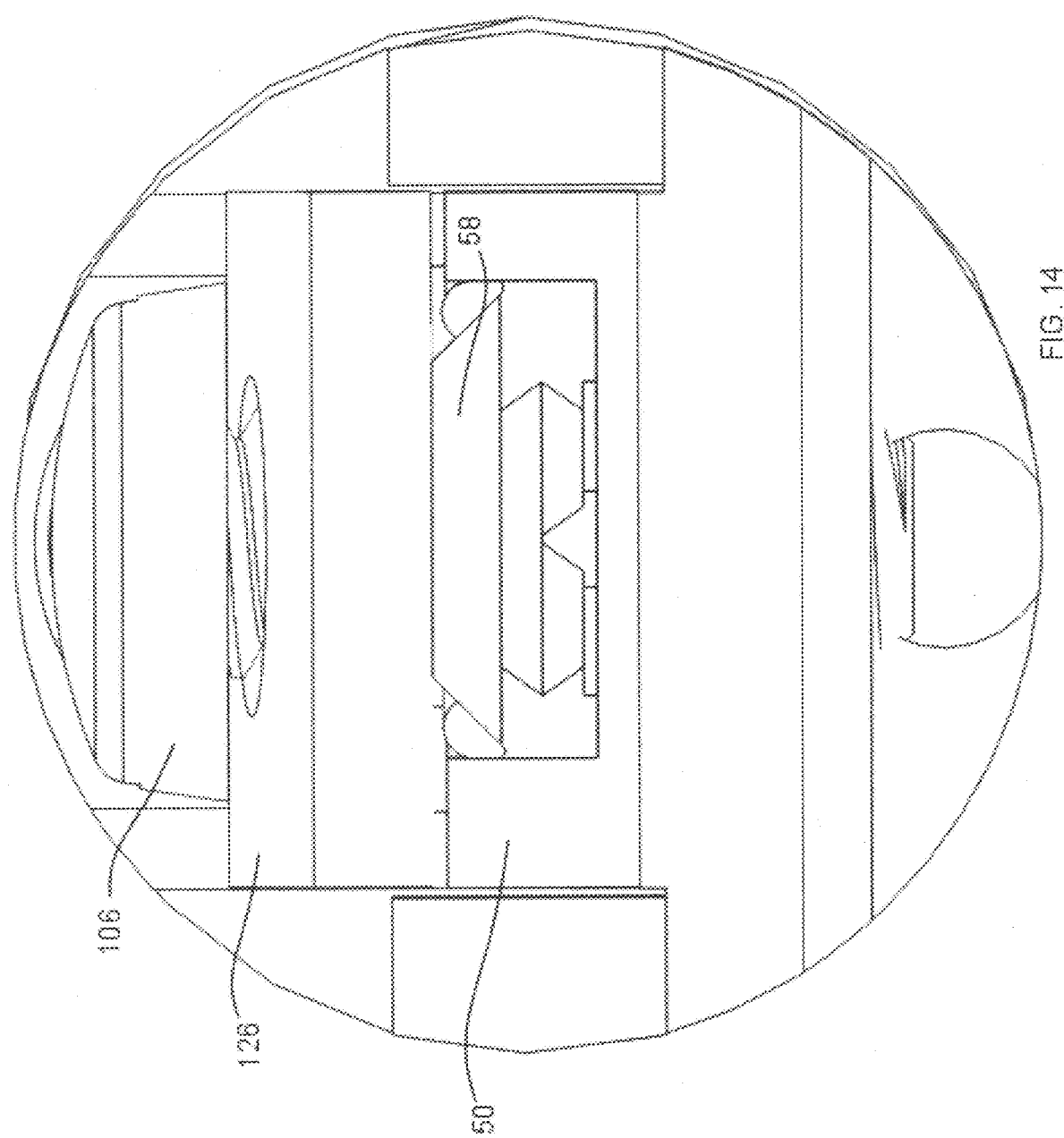

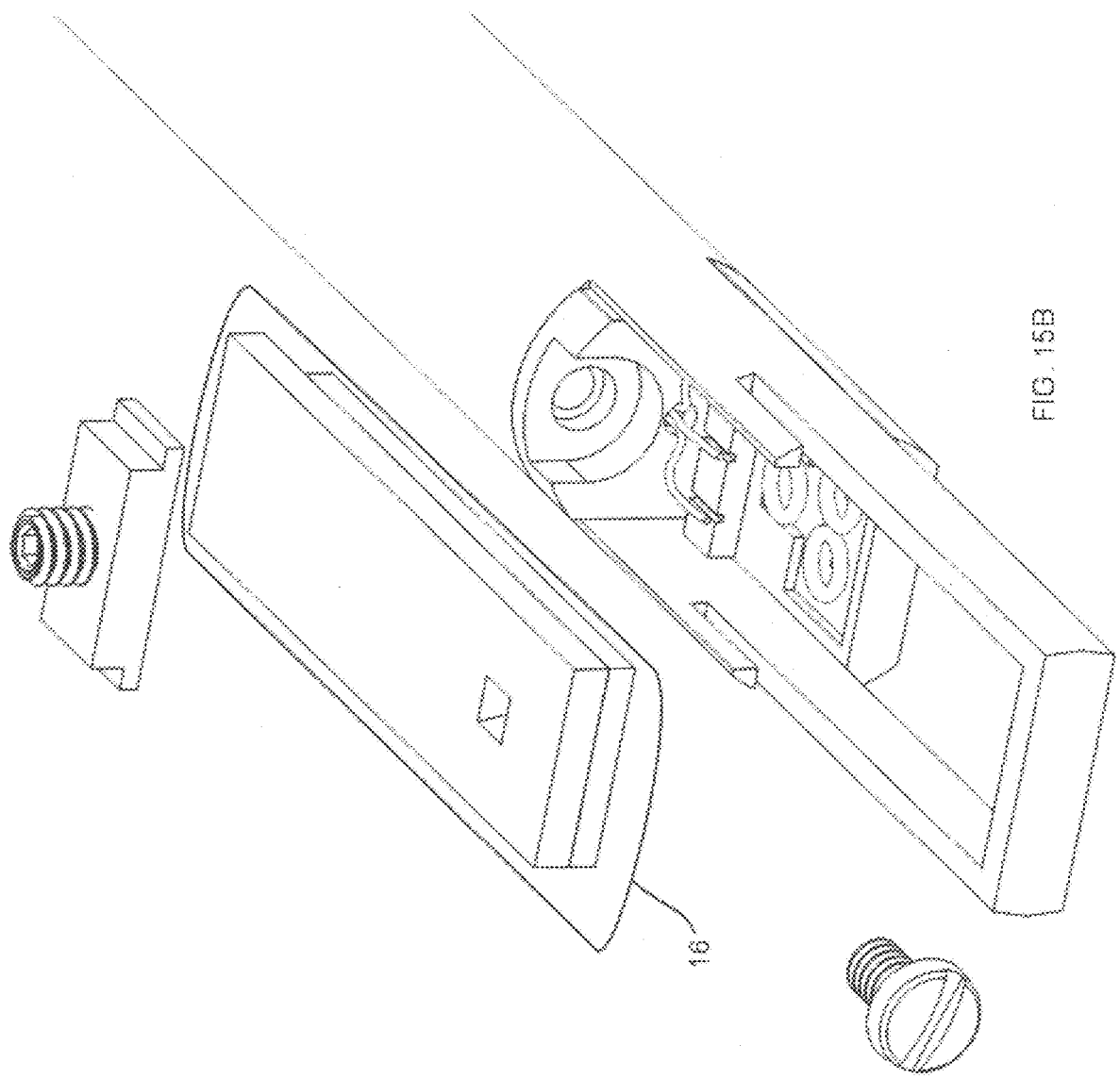

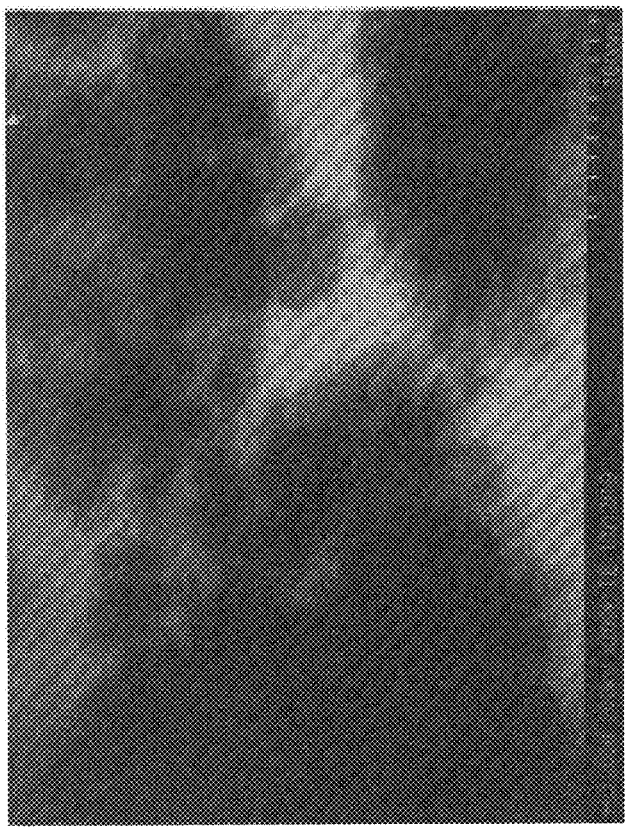
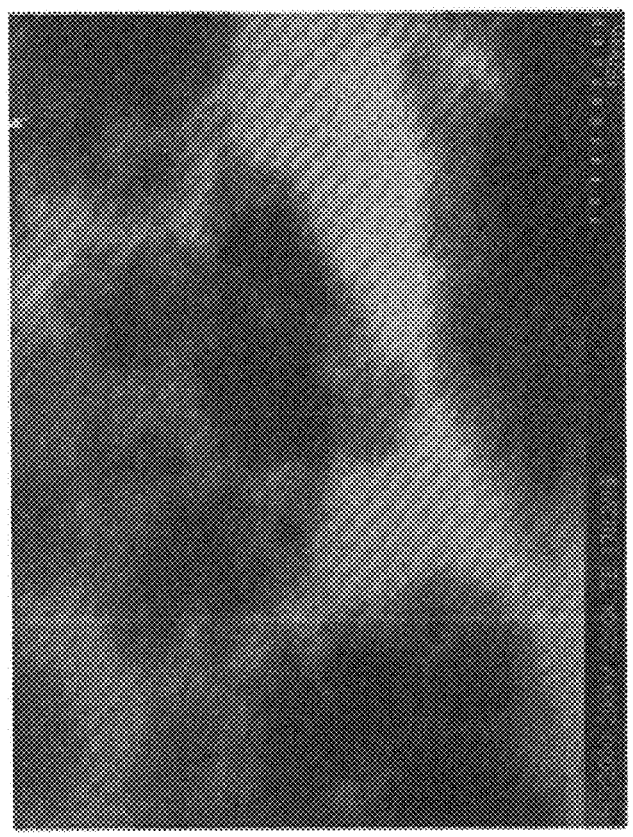
FIG. 23

NANOFLUIDIC CELL SYSTEM

FIELD

The invention relates to the field of high resolution electron and optical microscopy and cells used therein to flow and study in-liquid samples.

BACKGROUND

It is well known to study in-liquid samples using a cell placed within a high resolution microscope, but known methods suffer from, inter alia, poor fluid flow.

SUMMARY OF THE INVENTION

Forming one aspect of the invention is a cell for use in a microscope, the cell comprising a pair of Silicon-wafer dies.

The pair of dies define: a pair of slit-shaped windows disposed on opposite surfaces of the cell and arranged in perpendicular and spaced relation to one another to define a viewable volume interiorly of the cell at the region of overlap; a flow channel which includes the viewable volume and overlies and is substantially coterminous with one of the pair of slit-shaped windows; an elongate channel defined between the dies and leading towards the flow channel; and a conduit defined between the dies and coupling the elongate channel to the flow channel.

According to another aspect of the invention, the elongate channel can be orientated perpendicular to the flow channel.

According to another aspect of the invention, the ratio of the cross-sectional area of the elongate channel to the cross-sectional area of the flow channel can be at least 10:1.

According to another aspect of the invention, the conduit can comprise a slit-shaped channel that is arranged alongside the flow channel and abuts the flow channel at least substantially along the length thereof.

According to another aspect of the invention, the slit-shaped windows, slit-shaped channel and elongate channel can be wet-etched.

According to another aspect of the invention, the cell can further comprise a cap and a cover which define a cavity for receiving fluid and in which cavity the pair of dies is disposed, the cavity and the pair of dies being adapted such that, in use, the pressure of the fluid within the cavity causes the pair of dies to be urged together.

According to another aspect of the invention, the dies can be sufficiently rigid, and the conduit, elongate channel and the flow channel can be dimensioned, such that, in use, the pressure exerted by the fluid exterior of the dies in the cavity counters the pressure exerted by the fluid interior of the dies in an amount sufficient to avoid deleterious separation between surfaces of the dies.

According to another aspect of the invention, the cell can have a surface in which ports, for delivering and withdrawing fluids from the cell, are defined.

A modular system, for use with the cell and with a microscope, forms another aspect of the invention. The system comprises a holder, a clamp arrangement, a handle and apparatus.

The holder has a receiving surface. The receiving surface has, for each of the ports of the cell, a port, the ports of the holder being adapted such that, when the cell is operatively positioned upon the receiving surface, each port of the cell communicates with the port of the holder provided therefor. The receiving surface also has, for each port of the holder: a connector; and a conduit extending from said each port of the holder to the connector provided therefor.

The clamp arrangement is for releasably securing the cell upon the receiving surface.

The handle has a threaded bore and, for each connector, a receiver, the receivers and bore being positioned such that, when the holder is operatively positioned, each connector is coupled to the receiver provided therefor and the throughbore of the holder is aligned with the threaded bore.

The apparatus is for releasably securing the holder to the handle.

According to another aspect of the invention, the clamp arrangement can be defined by: a set screw operatively mounted to the handle; or a threaded bore in the holder and a screw adapted to urge the cell against the holder.

According to another aspect of the invention, the holder can define a throughbore, the handle can define a threaded bore and the apparatus for releasably securing the holder to the handle can be a screw.

Forming another aspect of the invention is a system for circulating a liquid through a nanofluidic cell, the system comprising:

a circuit providing a path for fluid communication that extends: from a volume of fluid relatively immiscible to the liquid to a supply of the liquid; from the supply of the liquid to the inlet of the nanofluidic cell; and from the outlet of the nanofluidic cell to an end volume, wherein the volume of fluid and the end volume are each large in comparison to the aggregate of: the amount of liquid to be circulated through the cell; the volume of the cell; and the dead volume of the path;

and wherein the liquid flows resultant from a pressure differential between the end volume and the volume of fluid.

Advantages, features and characteristics of the invention will become apparent upon a review of the following detailed description with reference to the appended drawings, the latter being briefly described hereinafter.

BRIEF DESCRIPTION OF THE DRAWINGS

FIG. 3A is a bottom view of the components of FIG. 3;

FIG. 3B is a top view of the components of FIG. 3

FIG. 14 is a view along section 14-14 of FIG. 12;

FIG. 15B is a partially assembled view of the structure of FIG. 15A and a view of an alternate embodiment of the structure of FIG. 2

FIG. 19 is a bright field electron transmission image of nanoparticles interacting in liquid water, captured using an embodiment of the invention [times from left to right 0 and 20 seconds]

DETAILED DESCRIPTION

Figure 1:
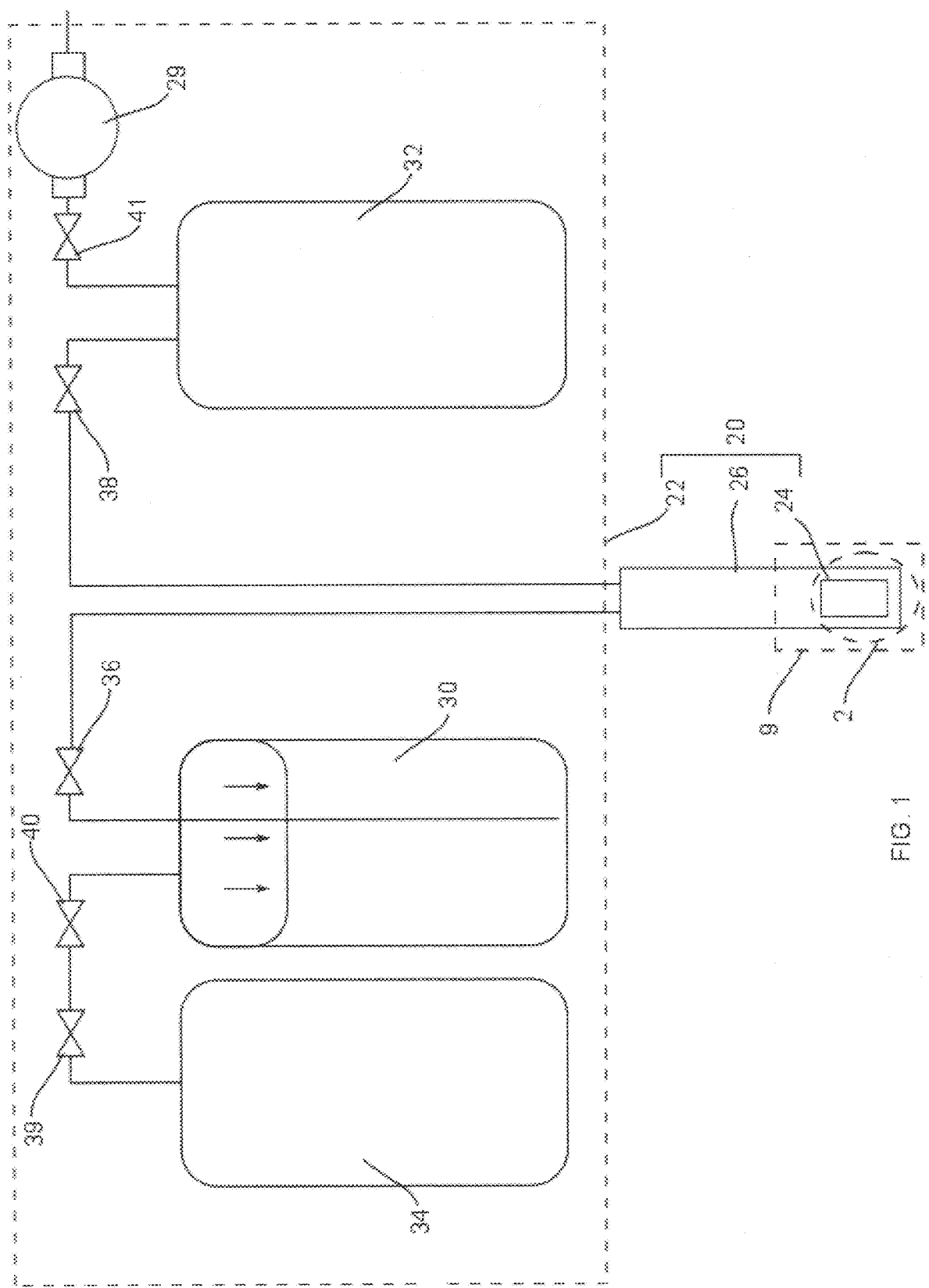
FIG. 1 is a schematic view of a system according to an exemplary embodiment of the invention.
Figure 2:
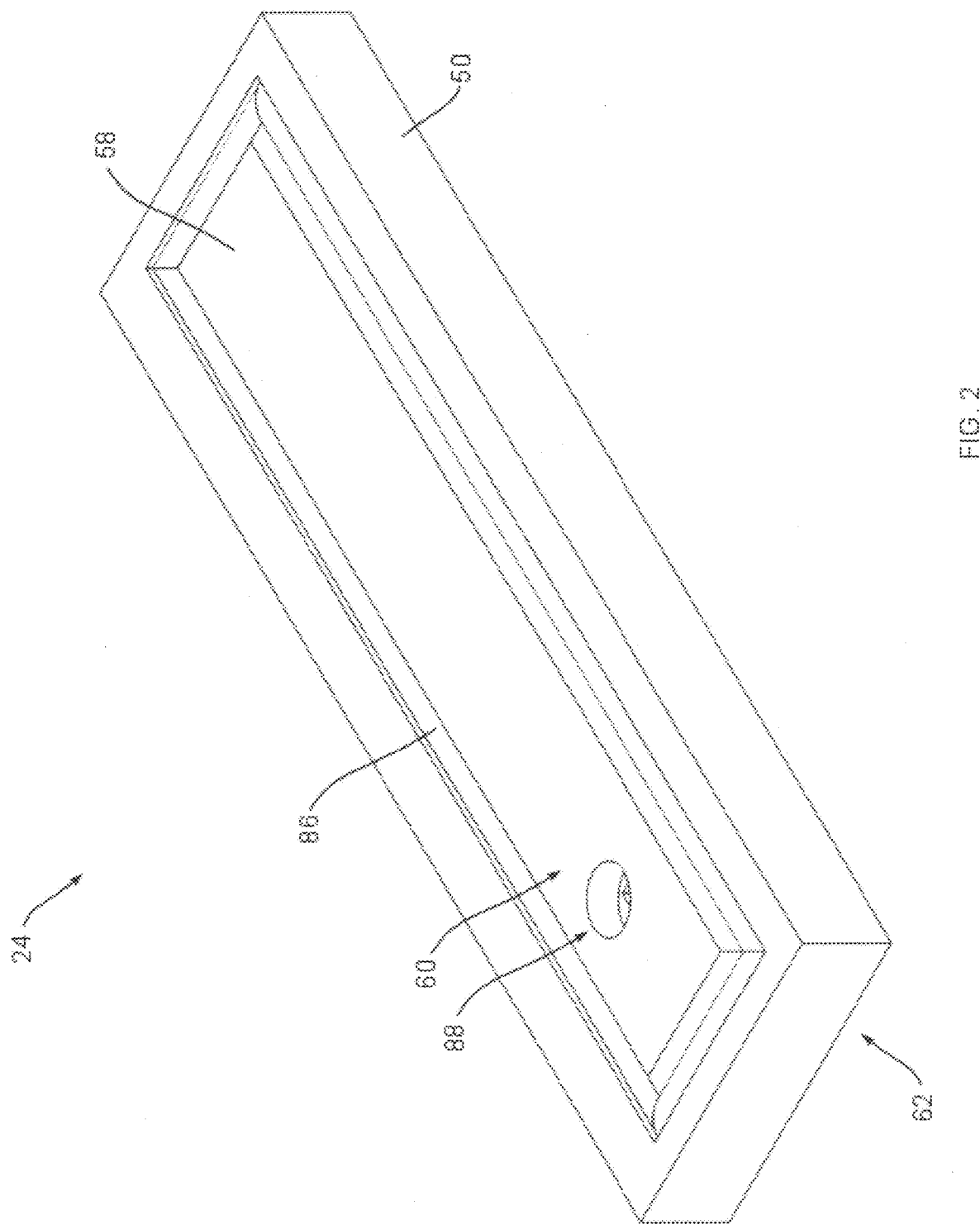
FIG. 2 is a perspective view of the structure of encircled area 2 of FIG. 1.
Figure 3:
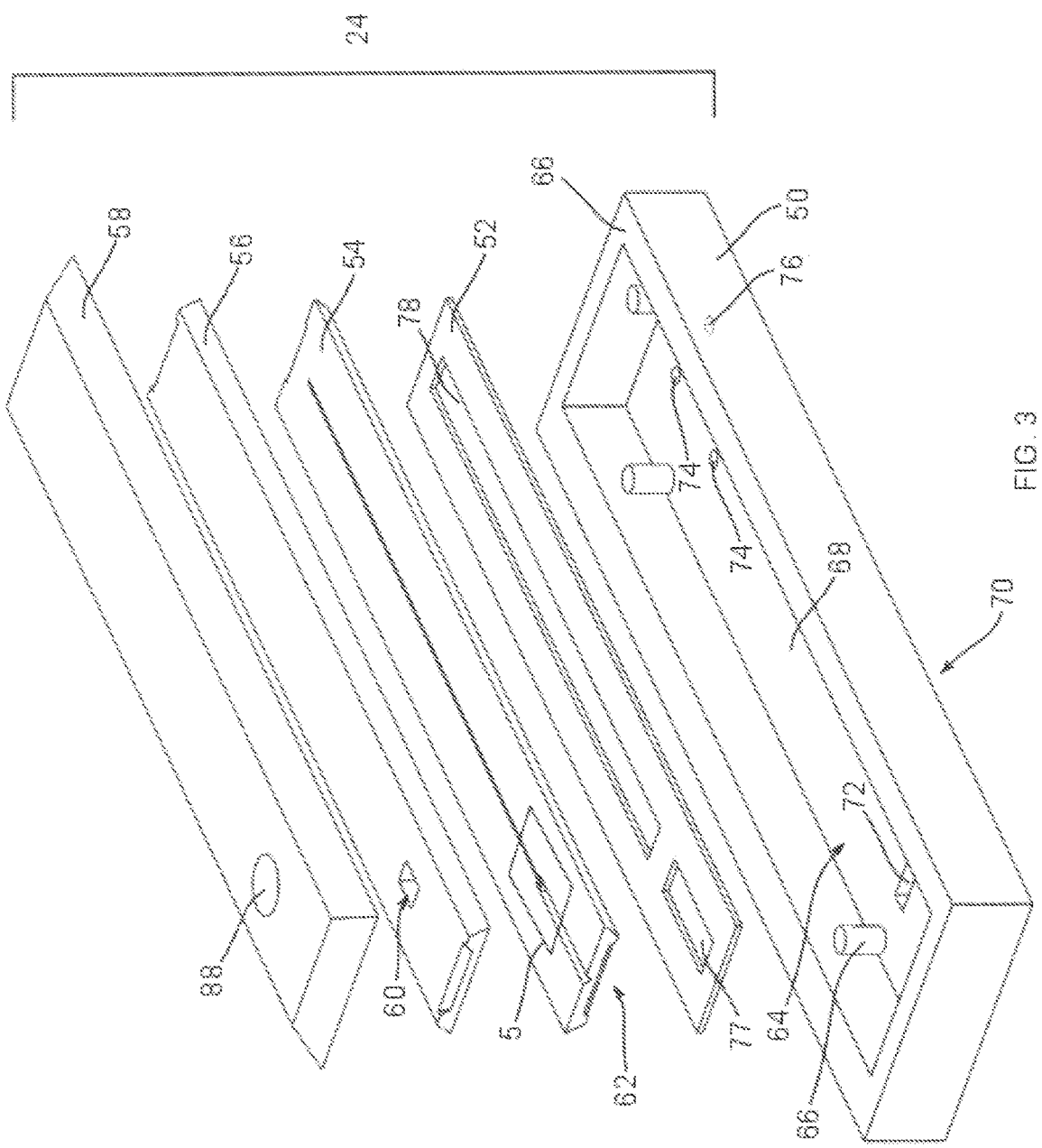
FIG. 3 is an exploded view of the structure of FIG. 2.
Figure 4:
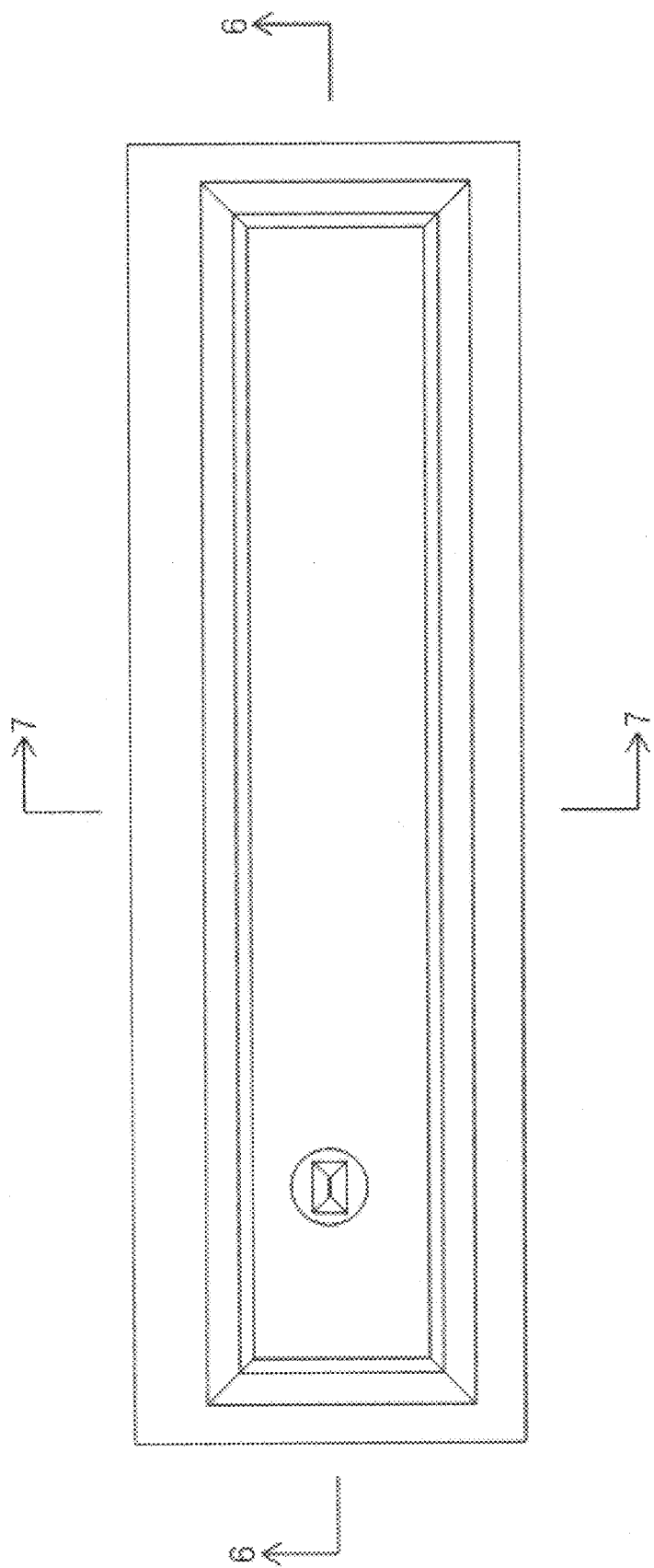
FIG. 4 is a plan view of the structure of FIG. 2.

An exemplary nanofluidic cell system 20 is shown schematically in FIG. 1 and will be seen to include a pumping arrangement 22, a nanofluidic cell 24 and a nanofluidic cell handler 26.

Pumping Arrangement

The exemplary pumping arrangement 22 will be seen to include a vacuum pump 29, a pair of vacuum-tight containers 30, 32, a pressurized gas cylinder 34, a needle valve 36, a zero volume shut-off valve 38, a pressure regulator 39, two shut-off valves 40, 41 and appurtenant tubing.

In use, a liquid that is to be circulated through cell 24 is placed into container 30, pressurized gas cylinder 34 via pressure regulator 39 is used to bring vacuum-tight container 30 to a desired internal pressure. Vacuum-tight container 32 is to be evacuated by vacuum pump 29. Valves 36 and 38 will be closed and valves 40 and 41 will be open during this procedure.

Once vacuum-tight container 32 is evacuated, valve 41 will be closed.

Once the desired differential pressure is reached and liquid is required to circulate through the cell, valve 38 will be fully opened. Needle valve 36 will be partially opened in order to fine control the flow rate through the cell 24. A path for pressurized gas communication extends from the pressurized gas cylinder 34 to container 30. A path for fluid communication extends: from container 30 to the inlet of the nanofluidic cell 24; and from the outlet of the nanofluidic cell to container 32, such that the liquid can flow through the cell 24 resultant from the pressure differential between container 30 and container 32. Because the volumes of containers 30 and 32 are substantially larger than the aggregate of the amount of liquid to be circulated through the cell, the volume of the cell and the dead volume of the path, constant differential pressure is attained for a extended period of time with uniform liquid flow, with none of the fluctuations typically associated with motor-driven pumping.

Cell

The exemplary nanofluidic cell is shown in FIGS. 2-8 and will be seen to include a tray 50, a gasket 52, a chip (bottom die) 54, a cap (top die) 56 and a cover 58.

The tray 50 is constructed out of Inconel by 3D printing and defines a hollow 64 in which a plurality of spacer posts 66 are provided, has a bottom 68 with a surface 70 through which a plurality of ports extend and which has an aperture 72, the ports including a pair of inlet ports 74 and an outlet port 76.

The gasket 52 is disposed at the bottom of the hollow 64, framed and aligned by the posts 66, has a window aperture 77 aligned with the aperture 72 of the bottom 68, has an elongate aperture 78 communicating with the inlet ports 74 and is shaped and dimensioned so as not to overlie the outlet port 76.

The chip 54 is a nanofabricated die from wet-etched silicon wafer, is disposed upon gasket 52 and defines a slit-shaped channel 80, an elongated channel 82 and a slit-shaped window 62. Slit-shaped window 62 is a layer of silicon nitride aligned with window aperture 77 and aperture 72 such that slit-shaped window 62 is fully visible through aperture 72. Elongate channel 82 leads to the slit-shaped channel 80 and is perpendicular thereto. Elongate channel 82 has a width less than 500 microns, specifically, about 30 microns. Slit-shaped channel 80 abuts slit-shaped window 62 such the entirety of the upstream edge of slit-shaped window 62 communicates, via slit-shaped channel 80, with elongate channel 82.

Cap 56 is also a nanofabricated die from a wet-etched silicon wafer, is disposed upon chip 54 and defines slit-shaped window 60. Slit-shaped window 60 is also a layer of silicon nitride and is orientated in perpendicular and spaced relation to slit-shaped window 62. The ratio of the cross-sectional area of the elongate channel to the cross-sectional area of the channel C defined between slit-shaped window 62 and cap 56 is at least 10:1. The depth D of channel C, i.e. liquid flow path is 10 μm or larger, specially, about 30 μm. The height H of channel C, i.e. liquid layer thickness, is about 50 nm.

Cover 58: is constructed out of Inconel by 3D printing; is disposed upon cap 56, overlapping cap 56, chip 54 and gasket 52 at all edges; is secured to tray 50 by epoxy 86 which vacuum seals the nanofluidic cell 24; and has a view port 88 to which slit-shaped window 60 is fully visible.

The components of the cell are shaped and dimensioned to define a cavity for receiving fluid, which cavity is adapted such that, in use, the pressure of the fluid within the cavity causes the chip 54 and the cap 56 to be urged together.

In this regard, it will be seen that:
  the fluid entering the cell via the inlet ports applies pressure against chip 54
  the fluid leaving the channel C is free to circulate around the periphery of gasket, central layer and cap before leaving via the outlet port 76; and
  the side edges of cap 56 and chip 54 are angled and inset from the tray 50 such that the fluid circulating around the periphery presses the edges of the cap 56 and chip 54 together.

This internal pressure minimizes the depth H of the channel C traversing the viewing area and improves visibility of the fluid. As previously indicated, the cross-section of the elongate channel 82 is much larger the cross section of channel C, thus ensuring that flow crosses the entirety of slit-shaped window 62 while pressure differential across view area is dominated by channel C cross sectional area and depth D.

Handler

Figure 9:
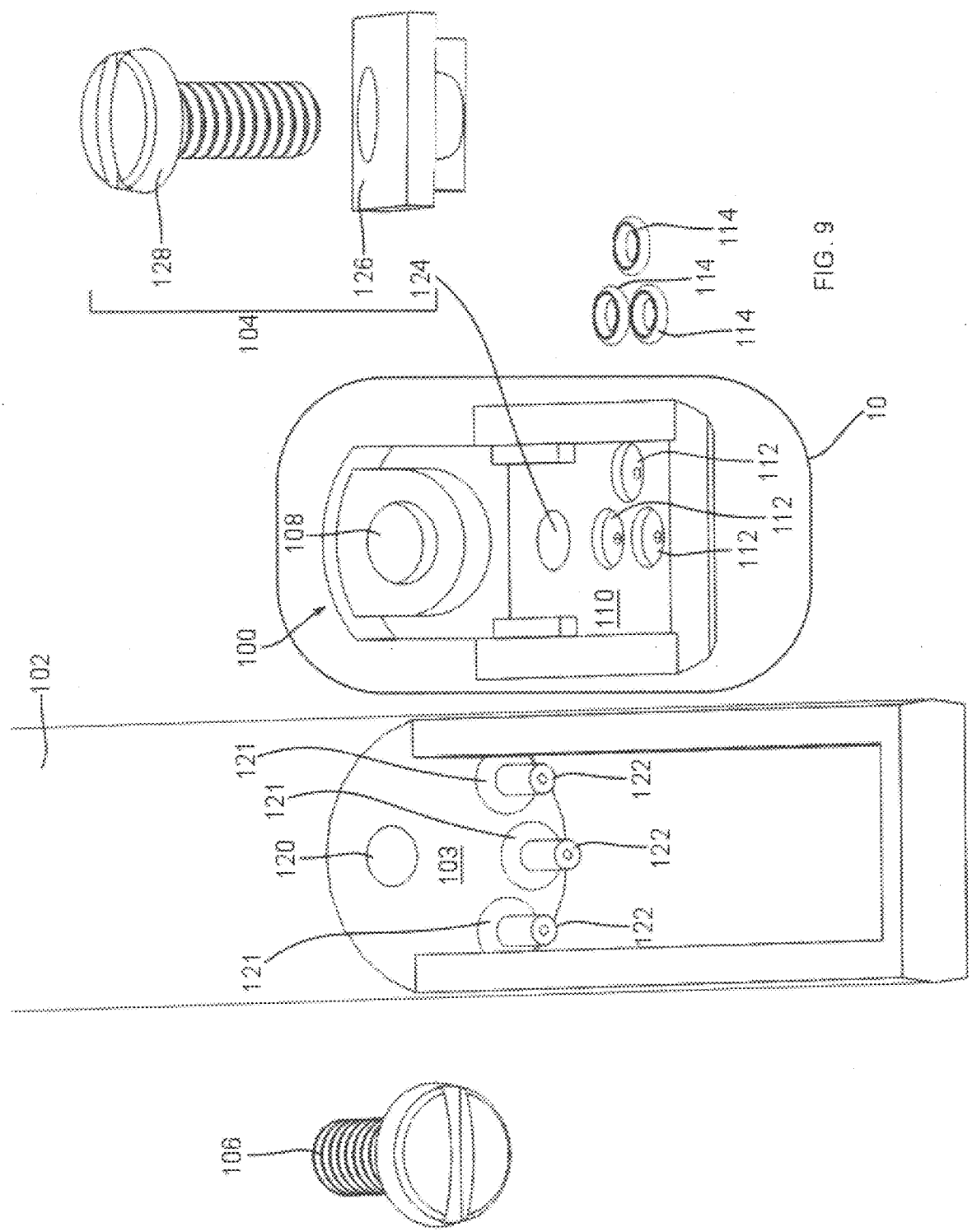
FIG. 9 is an exploded view of the structure of encircled area 9 of FIG. 1, with the structure of FIG. 2 removed for clarity.
Figure 10:
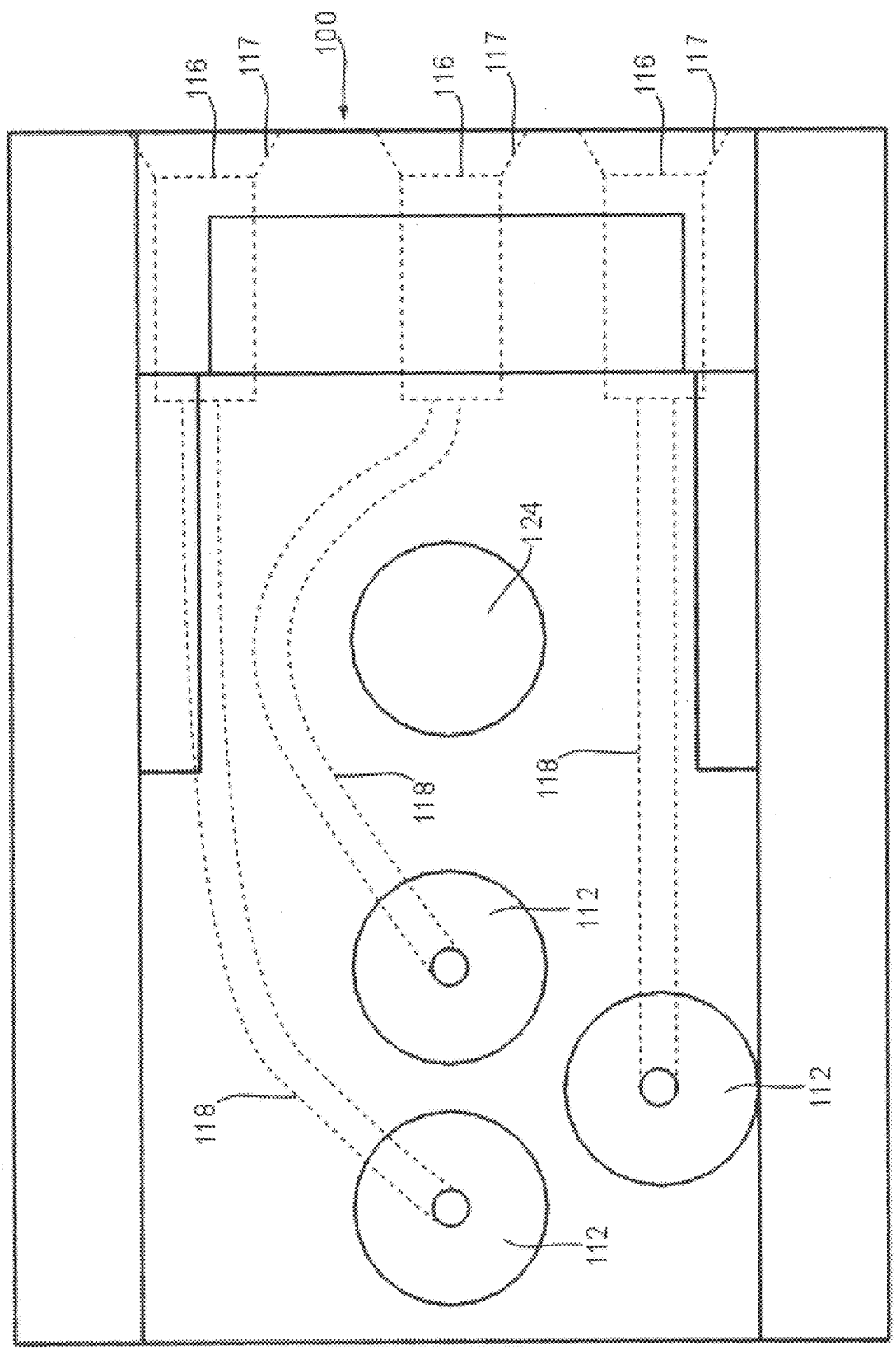
FIG. 10 is a plan view of the structure of encircled area 10 of FIG. 9.
Figure 11:
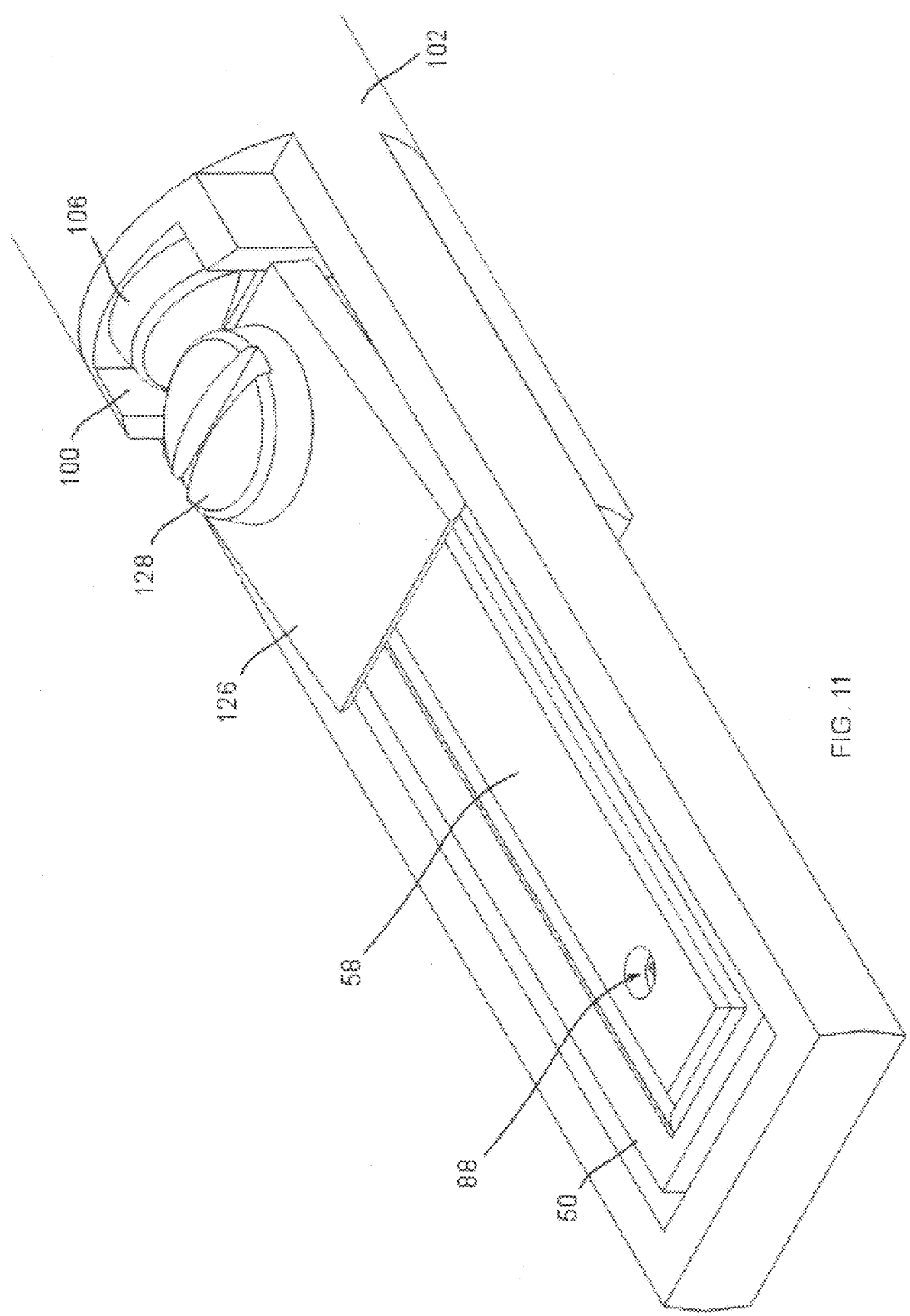
FIG. 11 is a view of the structure of FIG. 9 in use with the structure of FIG. 2
Figure 12:
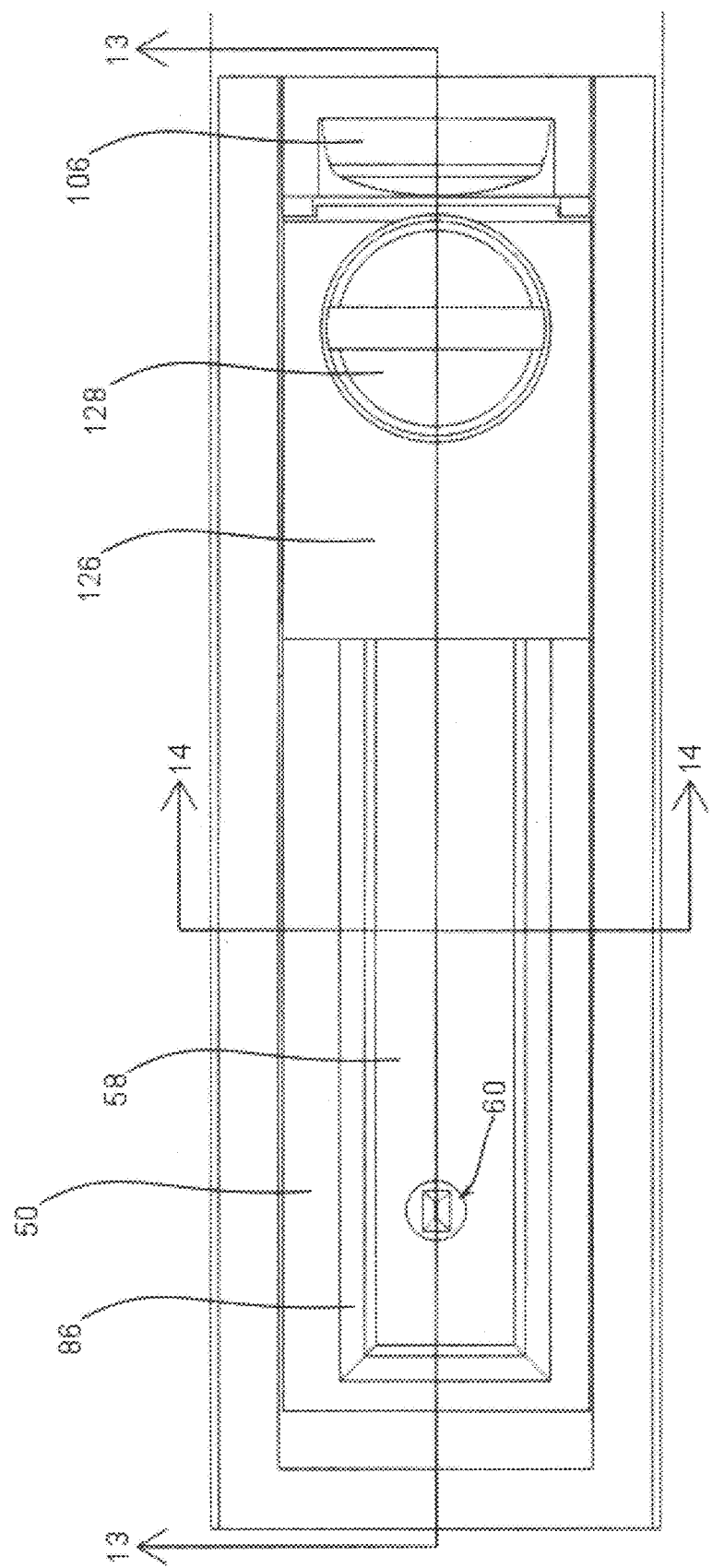
FIG. 12 is a plan view of the structure of FIG. 11.
Figure 13:
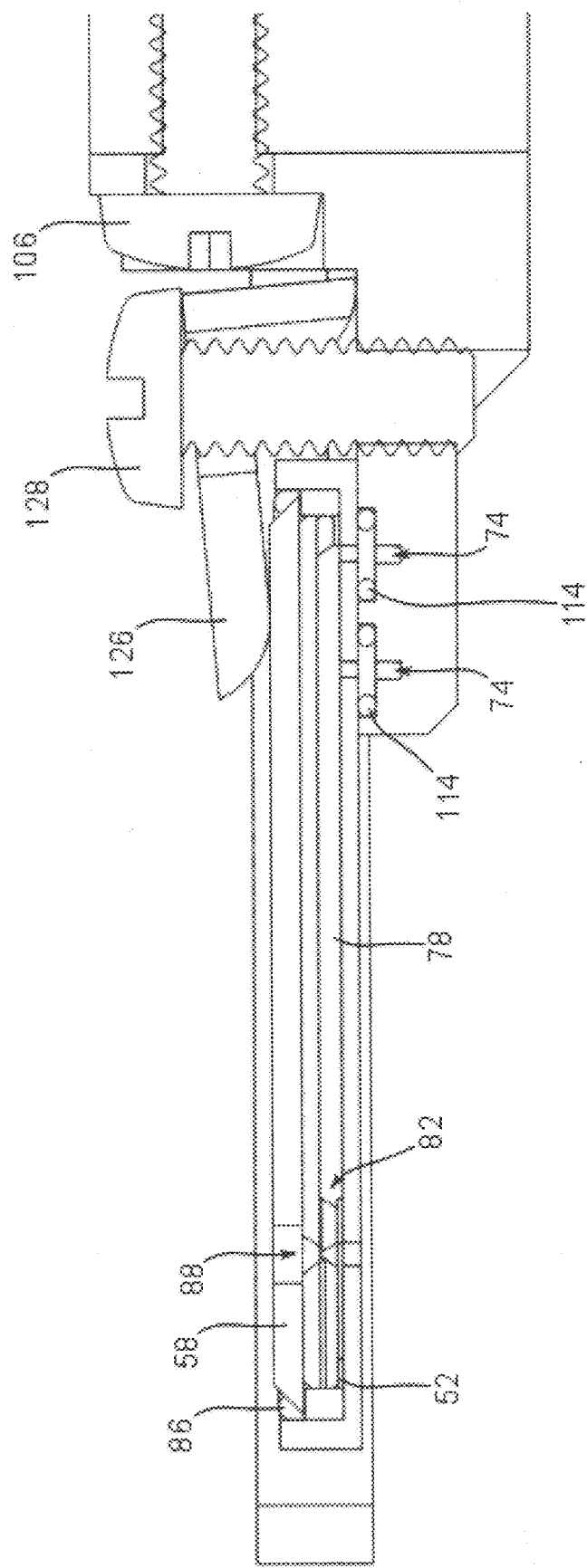
FIG. 13 is a view along section 13-13 of FIG. 12.
Figure 15A:
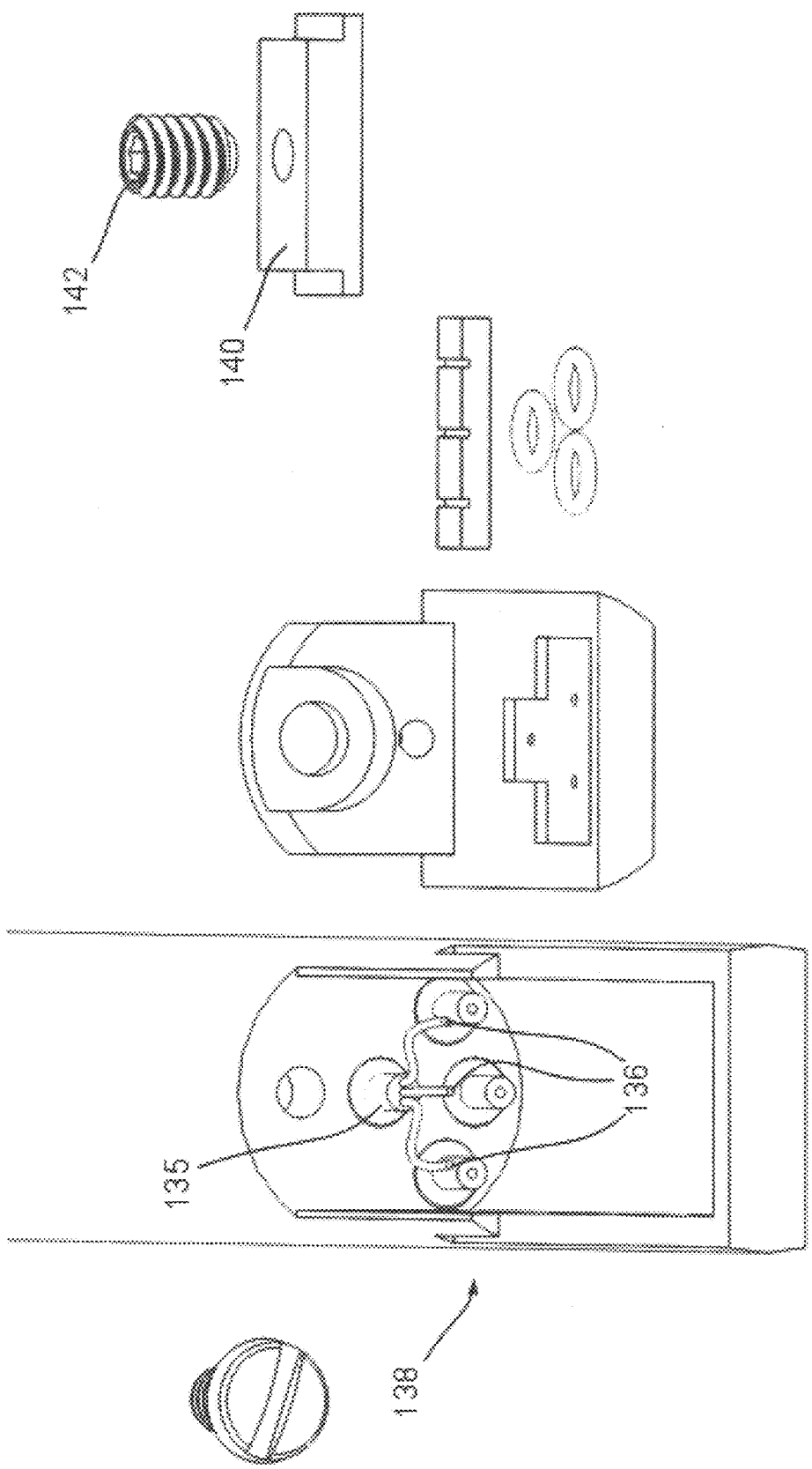
FIG. 15A is a view similar to FIG. 9 showing an alternate embodiment.
Figure 15C:
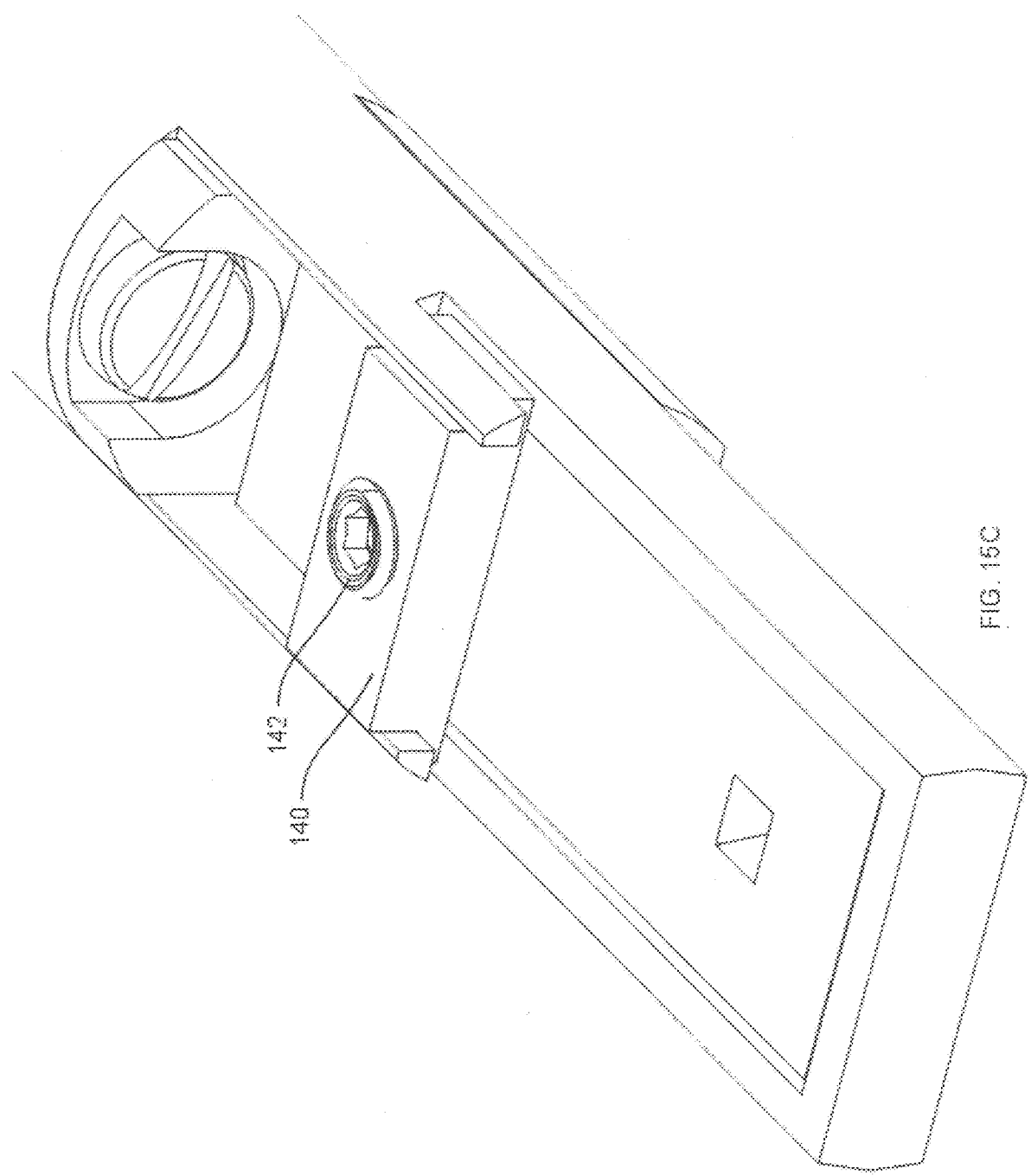
FIG. 15C is a view of the structure of FIG. 15B assembled for use.
Figure 16:
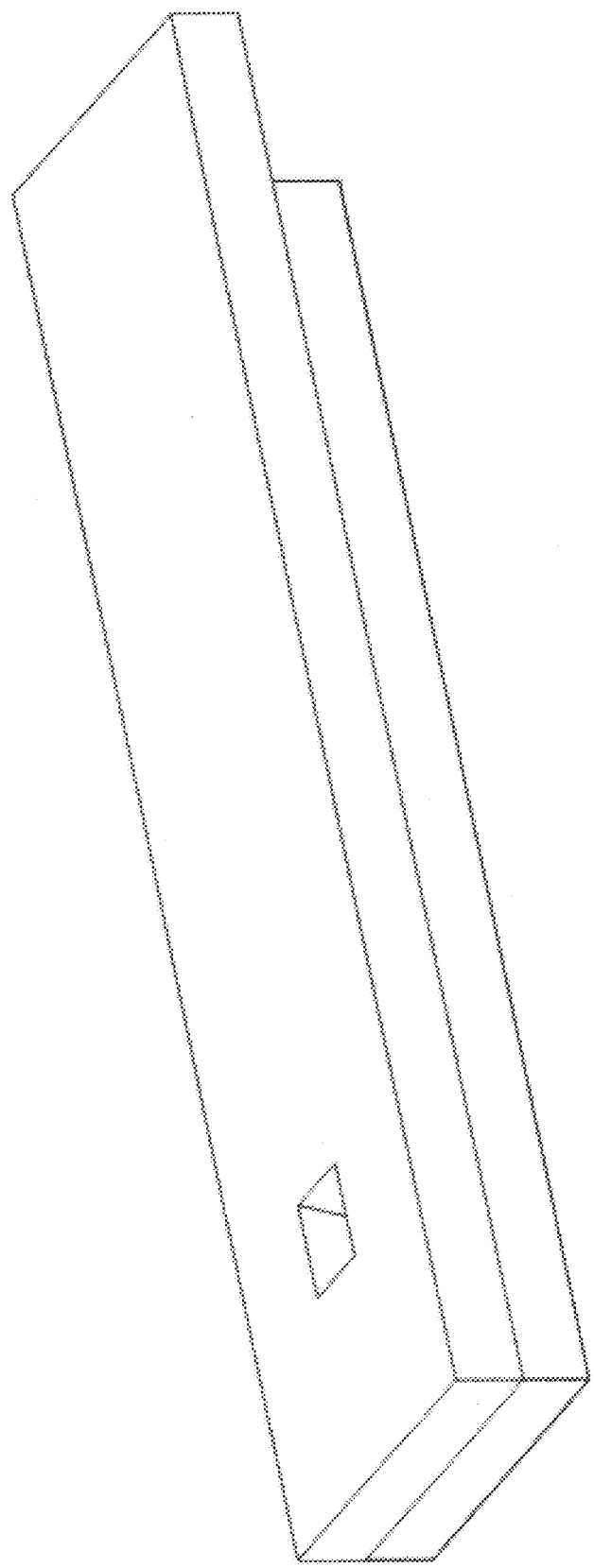
FIG. 16 is a view of the structure of encircled area 16 of FIG. 15B.
Figure 17:
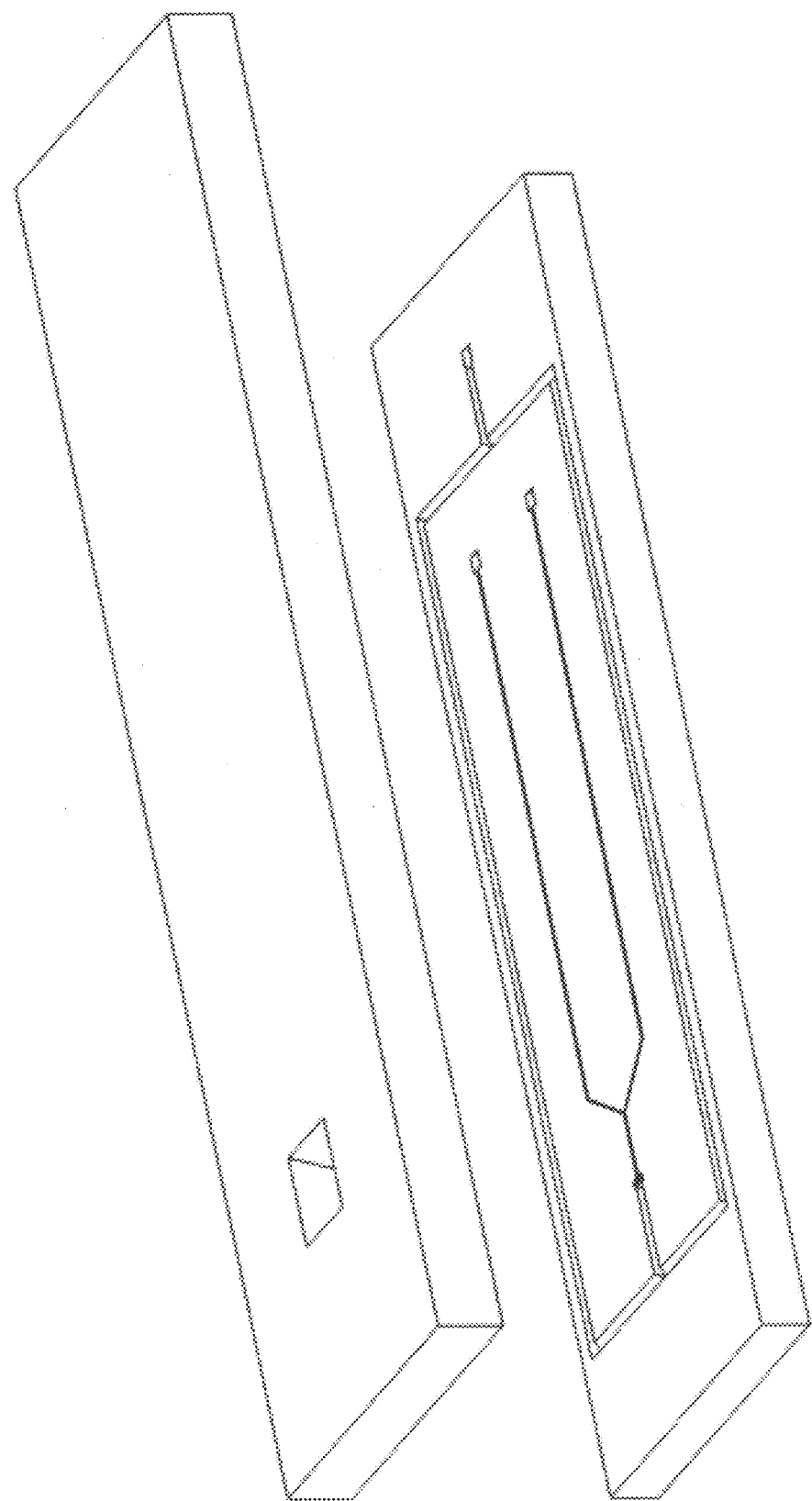
FIG. 17 is an exploded view of the structure of FIG. 16.

The components of the handler 26 are shown in FIG. 9 and will be seen to include: a holder 100, a handle 102, a clamp arrangement 104 and a screw 106.

The holder 100 has: (i) a throughbore 108; (ii) a receiving surface 110, the receiving surface having, for each of the ports of the tray, a port 112 in which an o-ring 114 is seated and (iii) for each port of the holder: a receiver 116; and a conduit 118 extending from said each port of the holder to the receiver provided therefor. Receivers 116 have 45-degree conical ends 117.

The handle 102 has a receiving surface 103, a threaded bore 120 and, for each receiver, a connector 122, and o-rings 121.

The clamp arrangement 104 is defined by a threaded bore 124 in the holder, a plate 126 and a screw 128.

Figure 20:
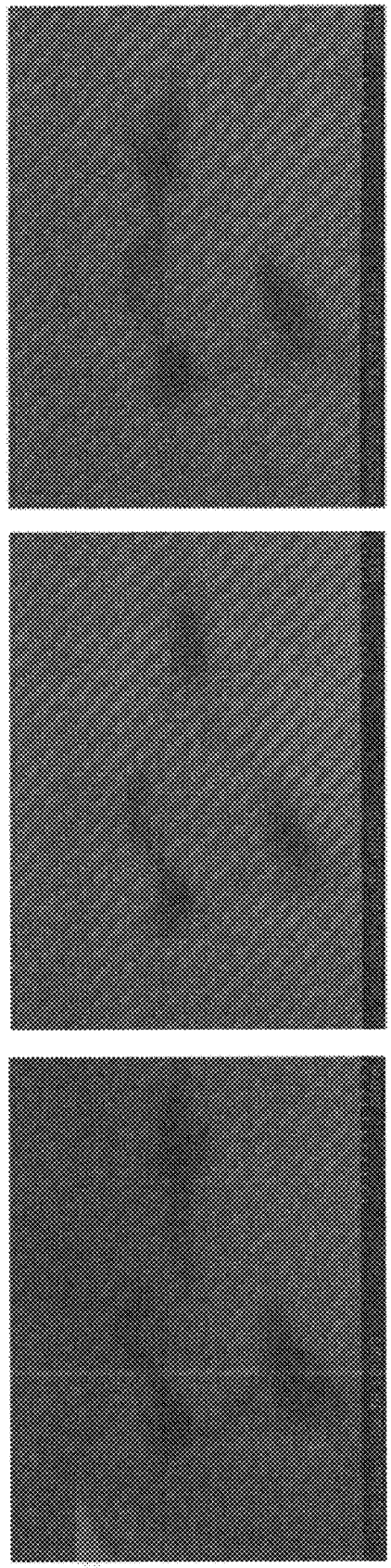
FIG. 20 is a bright field electron transmission image of nanoparticles interacting in liquid water, captured using an embodiment of the invention [times from left to right, 0, 22 and 24 seconds].

In use, as shown in FIGS. 11-14:
- the cell 24 is operatively secured upon the receiving surface 110
- each port 74,76 of the tray communicates with the port 112 of the holder provided therefor;
- the holder 100 is secured to the handle 102 by passage of the screw 106 through the throughbore 108 and engagement in the threaded bore 120
- each receiver 116 is coupled to the connector 122 provided therefor; o-rings 121 seating on 45-degree conical ended surface 117 provide three-body (connector 122-surface 103-surface 117) vacuum tight sealing.
- the clamp arrangement 104 secures the cell upon the receiving surface 110 and compresses o-rings 114 to provide two-body (surface 112-bottom surface of tray 50) vacuum tight sealing Experimental The system has been proven capable of providing useful imagery, as evidenced by FIGS. 19 and 20 which are bright field electron transmission image of nanoparticles interacting in liquid water, captured using an embodiment of the Invention. Time scale on FIG. 19, from left to right, 0 and 20 seconds; on FIG. 20, 0, 22 and 24 seconds.

Advantages

Persons of ordinary skill will readily appreciate advantages that the present invention provides for the capture of high quality microscopic images of in-liquid samples with controllable fluid flow. Without intending to be bound by theory, it is believed that the high quality imagery may follow from, inter a/ia:
- the relatively thin layer of fluid that passes through the viewing volume;
- low differential pressure required to flow through minimized channel depth D; and
- the relatively smooth flow that follows from use of the pumping apparatus with reduced outlet pressure.

Persons of ordinary skill will appreciate that variations are possible.

For example, whereas FIG. 1 shows a pressurized gas cylinder at the inlet and an evacuated container at the outlet, it will be understood that
- compressed gases other than air could be used for driving the liquid [any gas relatively immiscible to the liquid to be circulated can work]
- the use of the pressurized gas cylinder could be omitted when the required pressure at the inlet is below room conditions.
- positive pressure relative to atmosphere is not always required at the inlet
- vacuum is not always required at the end volume
- various combinations of valves could be used
- flow meters and devices for flow rate control could be interposed Moreover, whereas a single window is illustrated, it will be appreciated that a plurality of slit-shaped windows can be etched next to the slit-shaped window 62 on the cap 56, to enlarge the viewing area. The plurality of slit-shaped windows will overlap with the slit-shaped window 62 of the chip 54. Having larger windows increases the viewing area but will result in deformation, ending up with a larger channel depth H.

Figure 5:
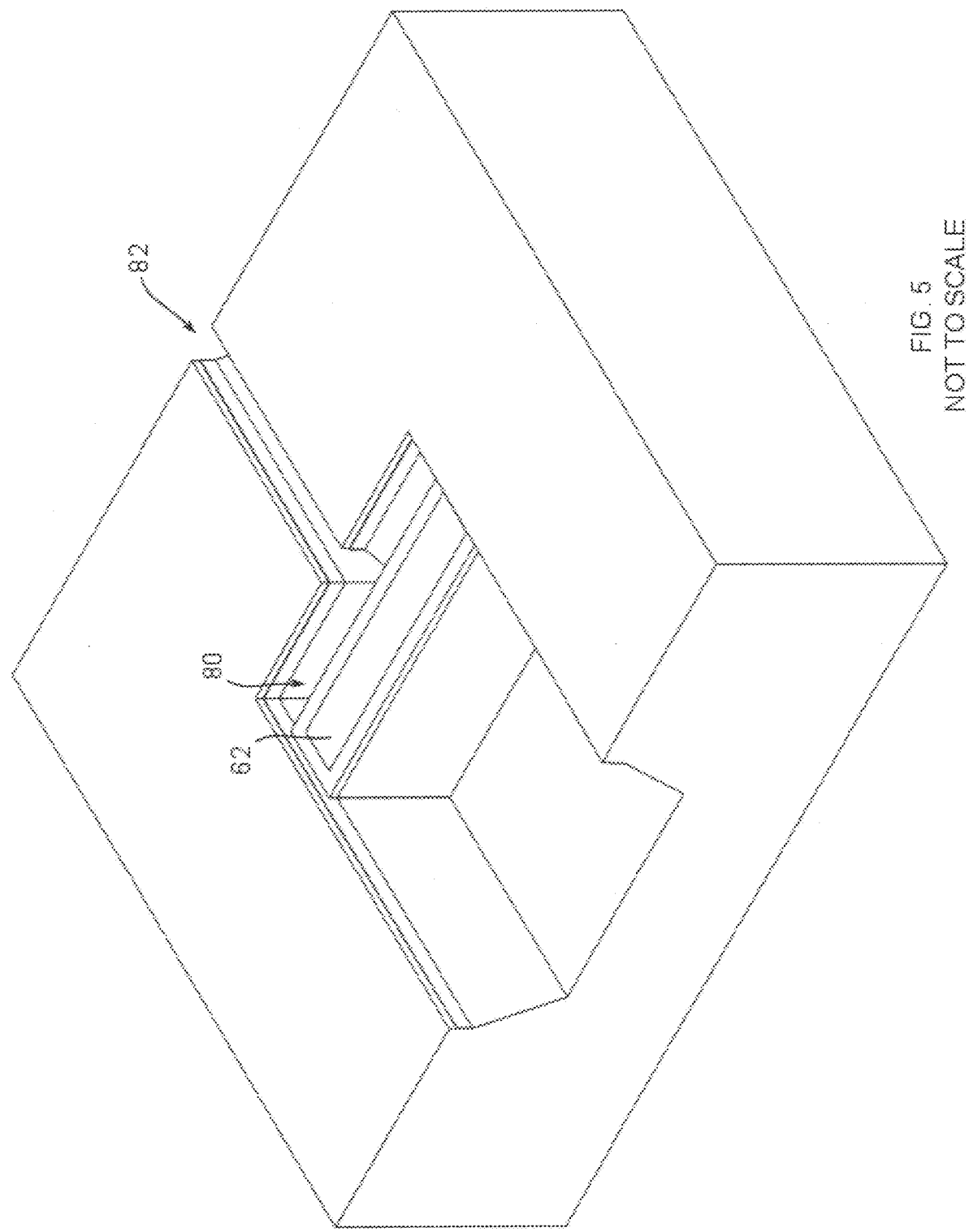
FIG. 5 is an enlarged, cut-away view of the structure of encircled area 5 of FIG. 3.
Figure 6:
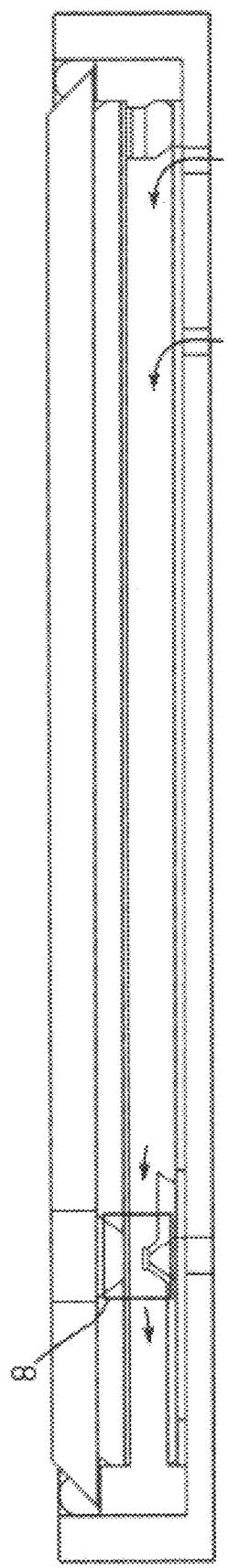
FIG. 6 is a view along section 6-6 of FIG. 4.
Figure 7:
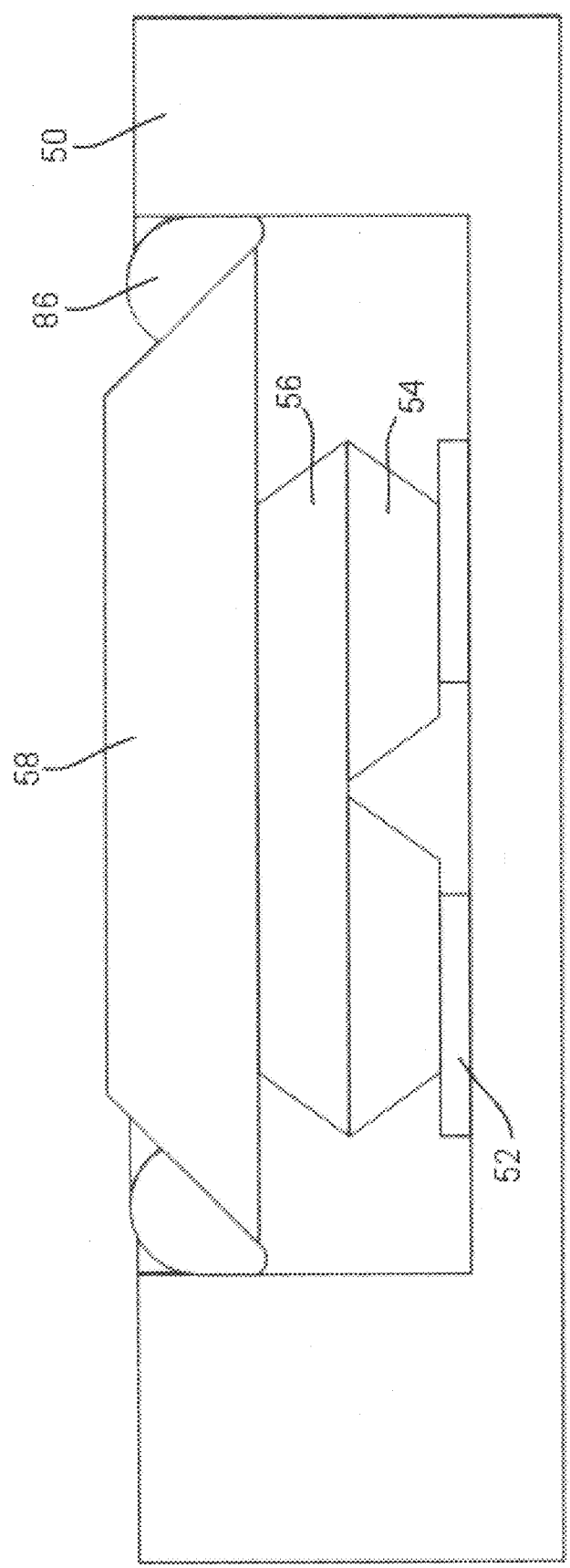
FIG. 7 is a view along section 7-7 of FIG. 4.
Figure 18:
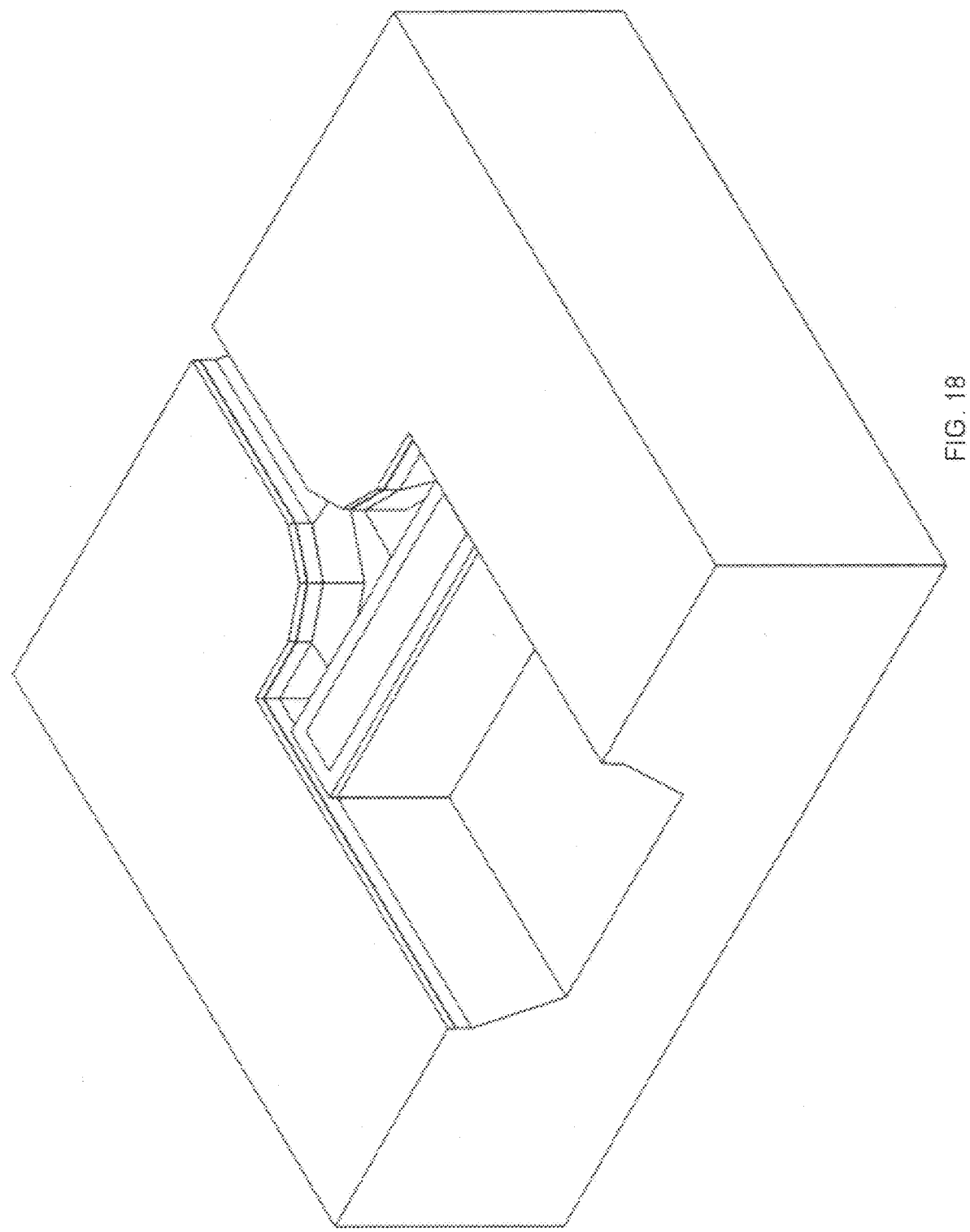
FIG. 18 is a view, similar to FIG. 5, showing an alternative embodiment.

Additionally, whereas a specific cell in shown in FIGS. 2-8, it will be understood that, inter alia:
- the layout and cross-sections of the channels can be varied
- the number of inlet and outlet ports can be varied
- As well, whereas a substantially T-shaped channel is shown in FIG. 5, a Y-shaped channel as shown in FIG. 18 has similar utility.

Figure 8:
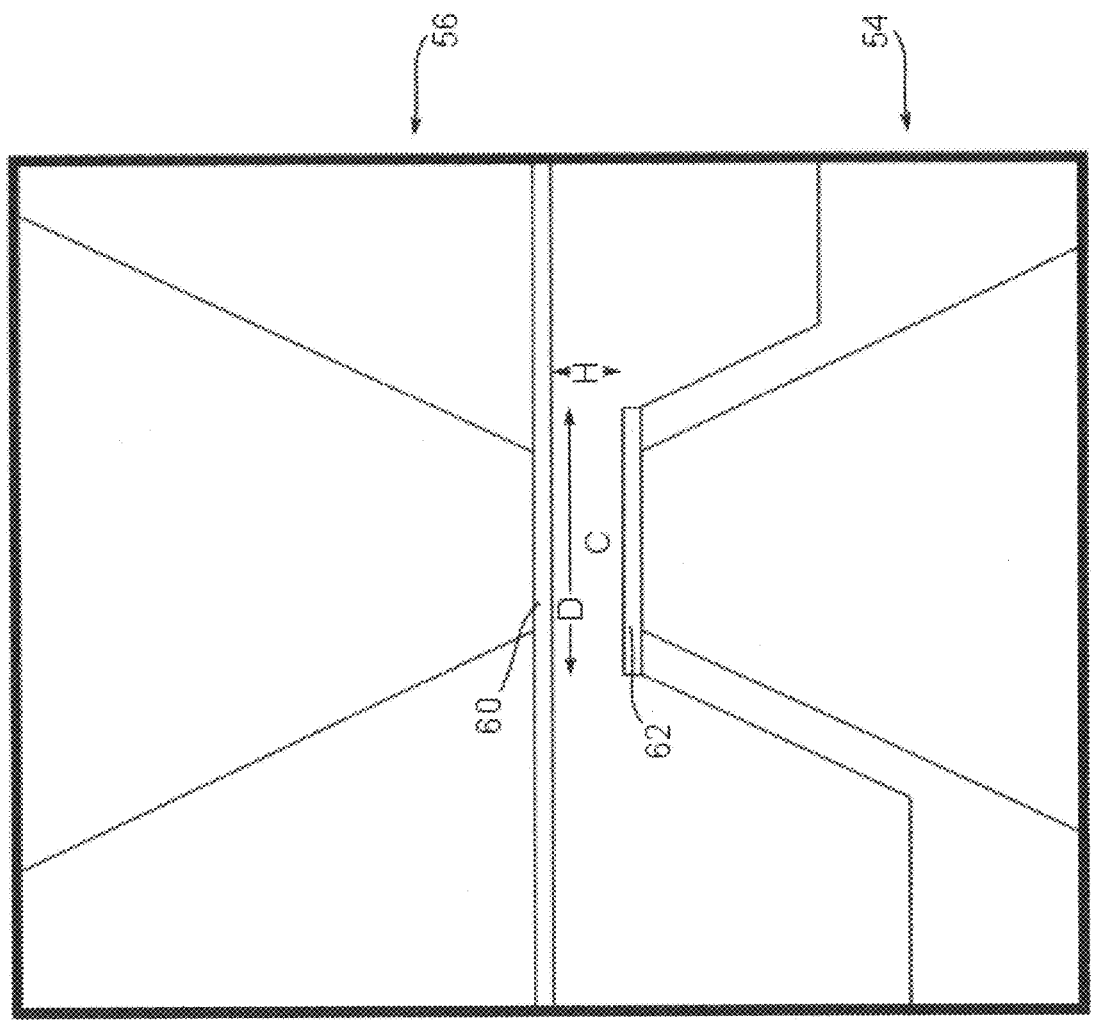
FIG. 8 is an enlarged view of encircled area 8 of FIG. 6.

Further, whereas the structure shown in FIG. 8 is indicated to have a liquid flow path of about 30 μm in length, this can be readily varied. Similarly, the height of channel C, i.e. liquid layer thickness, can be predictably varied between 50 nm and 100 μm.

Further, whereas a specific handler is shown in FIG. 9, it will be understood that, inter alia:
- other arrangements of clamps could be provided, such as that shown in FIG. 15A-17, wherein the handle has a forked end 138 in which a bracket 140 having a set screw 142 can be slid
- the holder could be provided with greater or lesser number of ports, as well as conductors and the like.

FIGS. 15A-17 also show a variation of the cell useful for low flow conditions and having electrical connectivity, for use in electrochemistry applications and wherein heating is required. Electrical connectivity is achieved throughout the implementation of a vacuum tight feedthrough 135 which have a plurality of wires 136 for electrical conduction. Sealing on the surface of the feedthrough 135 is attained in the same manner as for connectors 122. In this variant, the cap is oversized in relation to the chip and has electrical contacts on the underside (not shown) which, when operatively placed in the holder, engage leads that protrude therefrom. The cap and chip in this embodiment are thicker than those of the embodiment of FIG. 2-8 but are otherwise constructed in a similar fashion and sealed by conventional means such as wafer bonding, epoxy, metal bonding, etc.

Further, whereas the windows 60, 62 are always wet-etched, the channel can be wet-etched or plasma-etched.

As well, whereas the description uses the term "transparent", it will be understood that transparency to electron beams, rather than to the human eye, is of importance.

Accordingly, the invention should be understood to be limited only by the accompanying claims, purposively construed.

In addition to the cell, which is often single use; the implementation of o-rings for sealing and screws allow for the holder, connectors, and feedthrough to be replaced if required.

The invention claimed is:

1. A cell for use in a microscope, the cell being for use with a fluid, comprising:
   a pair of dies, the dies defining:
   a pair of slit-shaped windows disposed on opposite surfaces of the cell and arranged in perpendicular and spaced relation to one another to define a viewable volume interiorly of the cell at the region of overlap, the viewable volume, in use, receiving the fluid;
   a flow channel which includes the viewable volume and overlies and is substantially coterminous with one of the pair of slit-shaped windows;
   an elongate channel defined between the dies and leading towards the flow channel; and a conduit defined between the dies and coupling the elongate channel to the flow channel.

2. The cell according to claim 1, wherein the elongate channel is orientated perpendicular to the flow channel.

3. The cell according to claim 1, wherein the ratio of the cross-sectional area of the elongate channel to the cross-sectional area of the flow channel is at least 10:1.

4. The cell according to claim 1, wherein the conduit comprises a slit-shaped channel that is arranged alongside the flow channel and abuts the flow channel at least substantially along the length thereof.

5. The cell according to claim 4, wherein the slit-shaped windows, slit-shaped channel and elongate channel are wet-etched or dry-etched.

6. The cell according to according 1, wherein the cell further comprises a cap and a cover which define a cavity for receiving fluid and in which cavity the pair of dies is disposed, the cavity and the pair of dies being adapted such that, in use, the pressure of the fluid within the cavity causes the pair of dies to be urged together.

7. The cell according to claim 6, wherein the dies are sufficiently rigid, and the conduit, elongate channel and the flow channel are dimensioned, such that, in use, the pressure exerted by the fluid exterior of the dies in the cavity counters the pressure exerted by the fluid interior of the dies in an amount sufficient to avoid deleterious separation between dies and subsequent increase of flow channel height.

8. The cell according to claim 1, wherein the cell has a surface in which ports, for delivering and withdrawing fluids from the cell, are defined.

9. A system for use with the cell of claim 8 and with a microscope, the system comprising:

a holder having:
  a receiving surface, the receiving surface having, for each of the ports of the cell, a port, the ports of the holder being adapted such that, when the cell is operatively positioned upon the receiving surface, each port of the cell communicates with the port of the holder provided therefor; and
  for each port of the holder:
    a connector; and
    a conduit extending from said each port of the holder to the connector provided therefor;
a clamp arrangement for releasably securing the cell upon the receiving surface;
a handle having a threaded bore and, for each connector, a receiver, the receivers and bore being positioned such that, when the holder is operatively positioned, each connector is coupled to the receiver provided therefor and the throughbore of the holder is aligned with the threaded bore; and
apparatus for releasably securing the holder to the handle.

10. The system according to claim 9, wherein the clamp arrangement is defined by:
  a set screw operatively mounted to the handle; or
  a threaded bore in the holder and a screw adapted to urge the cell against the holder.

11. The system according to claim 9, wherein the holder defines a throughbore, the handle defines a threaded bore and the apparatus for apparatus for releasably securing the holder to the handle is a screw.

* * * * *